(12) United States Patent
Wang

(10) Patent No.: US 10,790,317 B2
(45) Date of Patent: Sep. 29, 2020

(54) FLEXIBLE DISPLAY DEVICE AND METHOD OF MANUFACTURING THE SAME

(71) Applicant: WUHAN CHINA STAR OPTOELECTRONICS SEMICONDUCTOR DISPLAY TECHNOLOGY CO., LTD., Wuhan, Hubei (CN)

(72) Inventor: Wei Wang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/339,370

(22) PCT Filed: Oct. 12, 2018

(86) PCT No.: PCT/CN2018/109968
§ 371 (c)(1),
(2) Date: Apr. 4, 2019

(87) PCT Pub. No.: WO2020/056814
PCT Pub. Date: Mar. 26, 2020

(65) Prior Publication Data
US 2020/0161345 A1    May 21, 2020

(30) Foreign Application Priority Data

Sep. 21, 2018   (CN) .......................... 2018 1 1107363

(51) Int. Cl.
*H01L 27/12*      (2006.01)
*H01L 27/15*      (2006.01)
(Continued)

(52) U.S. Cl.
CPC ........ *H01L 27/1248* (2013.01); *G06F 1/1652* (2013.01); *G09F 9/301* (2013.01);
(Continued)

(58) Field of Classification Search
CPC ............. H01L 27/1248; H01L 27/1218; H01L 27/1259; H01L 27/156; G06F 1/1652; G09F 9/301
(Continued)

(56) References Cited

U.S. PATENT DOCUMENTS

2005/0062047 A1* 3/2005 Nishikawa ........ H01L 29/78645
257/72
2005/0189535 A1* 9/2005 Hsueh ................. H01L 51/5284
257/40
(Continued)

FOREIGN PATENT DOCUMENTS

| CN | 102963155 A | 3/2013 |
| CN | 106129096 A | 11/2016 |
| CN | 108122927 A | 6/2018 |

*Primary Examiner* — Tong-Ho Kim
(74) *Attorney, Agent, or Firm* — Mark M. Friedman

(57) ABSTRACT

A flexible display device is provided. The flexible display device comprises a flexible substrate on which an active layer, a gate insulating layer, a gate metal layer, an interlayer insulating layer, a second metal layer, a planar layer, an emitting layer and an encapsulation layer are sequentially stacked. The gate insulating layer covers the active layer, the interlayer insulating layer covers the gate metal layer and the planar layer covers the interlayer insulating layer and the second metal layer. A plurality of channels is disposed on the interlayer insulating layer, and both two ends of the channels extending toward edge of the interlayer insulating layer to penetrate the interlayer insulating layer.

9 Claims, 5 Drawing Sheets

(51) Int. Cl.
 *G09F 9/30* (2006.01)
 *G06F 1/16* (2006.01)
(52) U.S. Cl.
 CPC ...... *H01L 27/1218* (2013.01); *H01L 27/1259* (2013.01); *H01L 27/156* (2013.01)
(58) Field of Classification Search
 USPC ......................................................... 257/72
 See application file for complete search history.

(56) References Cited

U.S. PATENT DOCUMENTS

2012/0256867 A1   10/2012  Annacone
2017/0162823 A1*   6/2017  Kim ........................ B32B 9/041
2017/0363893 A1*  12/2017  Matsukizono ........ H01L 29/786

\* cited by examiner

FLEXIBLE DISPLAY DEVICE AND METHOD OF MANUFACTURING THE SAME

BACKGROUND OF THE INVENTION

Field of Invention

The present invention relates to a field of display, and more particularly to a field of flexible display device and a method of manufacturing thereof.

Description of Prior Art

A flexible display device is a display device formed based on a flexible substrate material. Since the flexible display device has the characteristics of being curved, wide viewing angle and easy to carry, the flexible display device has a broad prospect and good market potential in portable products and most display applications.

There is a challenge to a flexible display back plate in the flexible display technology. The flexible display back plate requires all functional film layers to have high flexibility and reliability. Currently, the flexible back plate of the flexible display device is still fabricated by using metallic and inorganic functional film layers due to limitation of materials and processes.

In the traditional flexible back plate structure, there is a thick interlayer insulating layer, which plays the following roles:
1. Shielding signal interference between metal traces.
2. Providing hydrogen atoms for an active layer to repair defects in a high temperature hydrogenation process.

In order to achieve good insulation properties and a hydrogen replenishing effect, it is generally required that the interlayer insulating layer has a certain thickness. However, when the display device is bent, the thick interlayer insulating layer is prone to crack and crack propagation under bending stress, thereby causing the thin film transistor device failure.

SUMMARY OF THE INVENTION

The present invention provides a flexible display device, and it can solve the problem of that a thick interlayer insulating layer is prone to crack and crack propagation under bending stress when a display is bent and causing the thin film transistor device failure.

A flexible display device provided by one embodiment of the present invention includes a flexible substrate, an active layer disposed on a surface of the flexible substrate, a gate insulating layer disposed on the flexible substrate and covering the active layer, a gate metal layer disposed on the gate insulating layer, an interlayer insulating layer disposed on the gate insulating layer and covering the gate metal layer, a second metal layer disposed on the interlayer insulating layer, a planar layer disposed on the gate insulating layer and covering the interlayer insulating layer and the second metal layer, and an emitting layer and an encapsulation layer both disposed on the planar layer. The interlayer insulating layer is provided with a plurality of channels, two ends of the channels are extending toward edge of the interlayer insulating layer to penetrate the interlayer insulating layer, a vertical projection of the interlayer insulating layer is disposed below the second metal layer comprises a vertical projection of the second metal layer, a depth of the channels is not less than a thickness of the interlayer insulating layer, the channels divide the interlayer insulating layer into a plurality of insulating channels, and a longitudinal section of the insulating channels is presented as a positive trapezoid.

Preferably, the second metal layer includes a plurality of source/drain metal traces, and the insulating channels correspond to the source/drain metal traces one by one.

Preferably, the flexible substrate includes a first flexible substrate, and a first barrier layer, a second flexible substrate and a second barrier layer are sequentially stacked on the first flexible substrate.

A flexible display device provided by another embodiment of the present invention includes a flexible substrate, an active layer disposed on a surface of the flexible substrate a gate insulating layer disposed on the flexible substrate and covering the active layer, a gate metal layer disposed on the gate insulating layer, an interlayer insulating layer disposed on the gate insulating layer and covering the gate metal layer, a second metal layer disposed on the interlayer insulating layer, a planar layer disposed on the gate insulating layer and covering the interlayer insulating layer and the second metal layer, and an emitting layer and an encapsulation layer both disposed on the planar layer. The interlayer insulating layer is provided with a plurality of channels, two ends of the channels are extending toward edge of the interlayer insulating layer to penetrate the interlayer insulating layer, and a vertical projection of the interlayer insulating layer disposed below the second metal layer comprises a vertical projection of the second metal layer.

Preferably, a depth of the channels is not less than a thickness of the interlayer insulating layer.

Preferably, the channels divide the interlayer insulating layer into a plurality of insulating channels, and a longitudinal section of the insulating channel is presented as a positive trapezoid.

Preferably, the second metal layer includes a plurality of source/drain metal traces, and the insulating channels correspond to the source/drain metal traces one by one.

Preferably, the flexible substrate includes a first flexible substrate, and a first barrier layer, a second flexible substrate and a second barrier layer are sequentially stacked on the first flexible substrate.

A method of manufacturing a flexible display device provided by one embodiment of the present includes the steps of:
step S10 forming a flexible substrate on a substrate;
step S20 forming a patterned active layer on the flexible substrate;
step S20 forming a gate insulating layer which covers the active layer on the flexible substrate;
step S40 forming a gate metal layer on the gate insulating layer;
step S50 forming an interlayer insulating layer which covers the gate metal layer on the gate insulating layer;
step S60 forming a patterned second metal layer on the interlayer insulating layer;
step S70 forming channels on the interlayer insulating layer by etching processes;
step S80 forming a planar layer which covers the second metal layer and the interlayer insulating layer on the second metal layer; and
step S90 forming an emitting layer and an encapsulation layer on the planar layer.

Preferably, in the step S50, a metal electrode via is formed during forming the interlayer insulating layer.

Preferably, the step S60 includes step S61 forming a second metal layer on the interlayer insulating layer, step S62 coating a photoresist layer on the second metal layer, exposing and developing the photoresist layer to form a patterned photoresist layer and step S63 etching the second metal layer to form a patterned second metal layer.

Preferably, in the step S70, the source/drain metal traces are used as a first mask layer to etch the interlayer insulating layer, and thereby the channels are formed.

Preferably, in the step 63, after etching the second metal layer, the photoresist layer disposed on the source/drain metal traces is kept, and the photoresist layer is used as a second mask layer for etching the interlayer insulating layer.

The patterned interlayer insulating layer is used to replace the existing entire film structure, so that the channels become the deformation occurring main region when the panel is bent. Accordingly, and the reliability of the display device is improved under bending stress. Simultaneously, the thin film transistor device failure resulting from the interlayer insulating layer being crack and crack propagation under bending stress can be prevented. Also, the source and drain metal traces are used as the interlayer insulating layer and an etching mask for photoresist, so that insulating channels corresponding to the source and drain metal traces one by one can be obtained without adding a mask, and the channels can be formed in the bending stress concentration zone, and accordingly keep the cost down.

BRIEF DESCRIPTION OF THE DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

Figure 1:
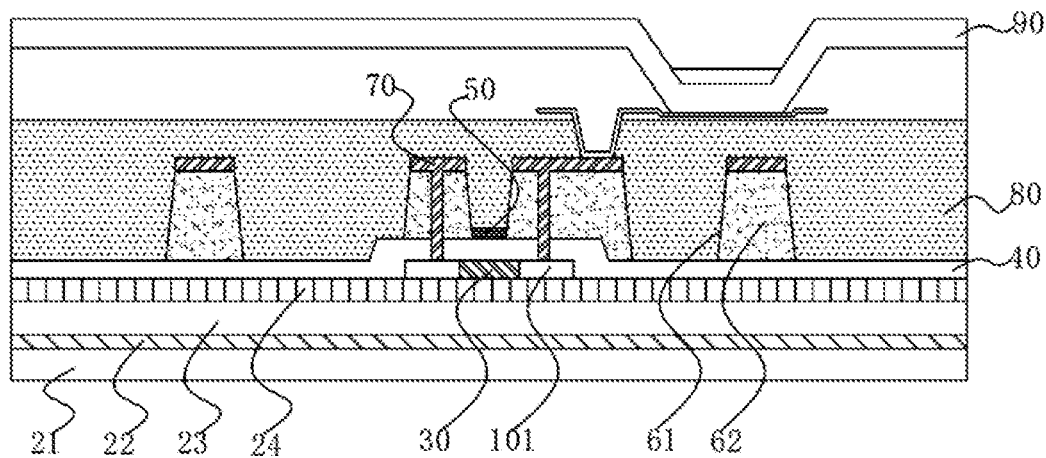
FIG. 1 is a schematic view of a flexible display device according to one embodiment of the present invention.

| Reference marks: | |
| --- | --- |
| substrate | 10 |
| flexible substrate | 20 |
| first flexible substrate | 21 |
| first barrier layer | 22 |
| second flexible substrate | 23 |
| second barrier layer | 24 |
| active layer | 30 |
| gate insulating layer | 40 |

| -continued | |
| --- | --- |
| Reference marks: | |
| gate metal layer | 50 |
| interlayer insulating layer | 60 |
| channel | 61 |
| insulating spacer | 62 |
| metal electrode via | 63 |
| source/drain metal traces | 70 |
| planar layer | 80 |
| emitting layer | 90 |
| active layer | 101 |
| photoresist layer | 102 |

DETAILED DESCRIPTION OF THE PREFERRED EMBODIMENTS

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

In order to achieve good insulation properties and a hydrogen replenishing effect, it is generally required that the interlayer insulating layer has a certain thickness. However, when the display device is bent, the thick interlayer insulating layer is prone to crack and crack propagation under bending stress, thereby causing the thin film transistor device failure. A flexible display device according to one embodiment of the present invention can solve above problems.

Referring to FIG. 1, a flexible display device includes a flexible substrate 20, and an active layer 30, a gate insulating layer 40, a gate metal layer 50, an interlayer insulating layer 60, a second metal layer, a planar layer 80, an emitting layer 90 and an encapsulation layer which are sequentially stacked on the flexible substrate 20. The second metal layer is at least used as a source/drain metal trace. The gate insulating layer 40 covers the active layer 30. The interlayer insulating layer 60 covers the gate metal layer 50. The planar layer 80 covers the interlayer insulating layer 60 and the second metal layer.

The interlayer insulating layer 60 is provided with a plurality of channels 61. Two ends of the channels 61 are extending toward edge of the interlayer insulating layer 60 to penetrate the interlayer insulating layer 60, and a vertical projection of the interlayer insulating layer 60 disposed below the second metal layer includes a vertical projection of the second metal layer.

The metal layer 50 is covered by the interlayer insulating layer 60, so that gate metal traces and source/drain metal traces 70 are insulated, and then signal interference between the metal traces are avoided. Meanwhile, defects of an active layer 101 is recovered by providing hydrogen atoms in a high temperature hydrogenation process. On the basis of that the interlayer insulating layer 60 has good insulating properties and a hydrogenation function, a patterned interlayer insulating layer 60 is used to replace the existing entire film structure. Thus, the channels 61 become the main deformation occurring region when the panel is bent. Moreover, since a thickness of bottom of the channels 61 is much thinner, it can withstand a greater bending stress, and then the reliability of the display device is improved under the bending stress. Furthermore, the interlayer insulating layer 60 being crack and crack propagation under the bending stress resulting the thin film transistor device failure can be prevented.

It should be noted that the interlayer insulating layer 60 may be a single layer structure or a multilayer structure and is made of inorganic materials, such as SiOx, SiNx or $Al_2O_3$. The interlayer insulating layer 60 is deposited on the gate insulating layer 40 by chemical vapor deposition, physical vapor deposition, spin coating, or the like. It can be understood that, in a specific embodiment of the present invention, the interlayer insulating layer 60 can also be made of other materials by other methods.

Specifically, a depth of the channels 61 is not less than a thickness of the interlayer insulating layer 60. It can be understood that if the depth of the channels 61 is deeper, the thickness of the inorganic film layer of the bottom of the channels 61 is thinner. Therefore, it can withstand a greater bending stress and improve the reliability of the display device under the bending stress. Moreover, if the depth of the channels 61 is deeper, the manufacturing time and production cost are increased. Accordingly, in the embodiment of the present invention, the depth of the channels 61 can be selected in accordance with the production cost while the performance of the channels 61 is ensured.

The channels 61 divide the interlayer insulating layer 60 into a plurality of insulating channels 62, and a longitudinal section of the insulating channels 62 is presented as a positive trapezoid. As mentioned above, the interlayer insulating layer 60 is deposited on the gate insulating layer 40 by chemical vapor deposition, physical vapor deposition, spin coating, or the like. The longitudinal section of the insulating channels 62 is set to a positive trapezoid so as to increase contact area between the bottom of the insulating channels 62 and the gate insulating layer 40. Accordingly, the insulating channels 62 and the gate insulating layer 40 are more tightly bonded so as to prevent the insulating channels 62 from shifting or the gate insulating layer 40 from detaching while the display device is bent.

More particularly, the second metal layer includes a plurality of source/drain metal traces 70, and the insulating channels 62 correspond to the source/drain metal traces 70 one by one. The insulating channels 62 are used to insulate the gate metal traces and the source/drain metal traces 70 so as to ensure insulation. Furthermore, the number of insulating channels 62 is reduced so as to increase the channels 61 area, and then the bending stress is better concentrated in the channels 61. Accordingly, the reliability of the display device is improved under the bending stress.

The flexible substrate 20 includes a first flexible substrate 21, and a first barrier layer 22, a second flexible substrate 23 and a second barrier layer 24 are sequentially stacked on the first flexible substrate 21. The reliability of the flexible substrate 20 is improved by forming the flexible substrate 20 with a multilayer structure, and thus preventing the flexible substrate 20 from being crack under the bending process.

It should be noted that the first barrier layer 22 and the second barrier layer 24 are consisted of inorganic materials such as $SiO_x$, $SiN_x$ or the like. It can be understood that the materials of the first barrier layer 22 and the second barrier layer 24 can be included, but are not limited to, the above list.

Figure 2:
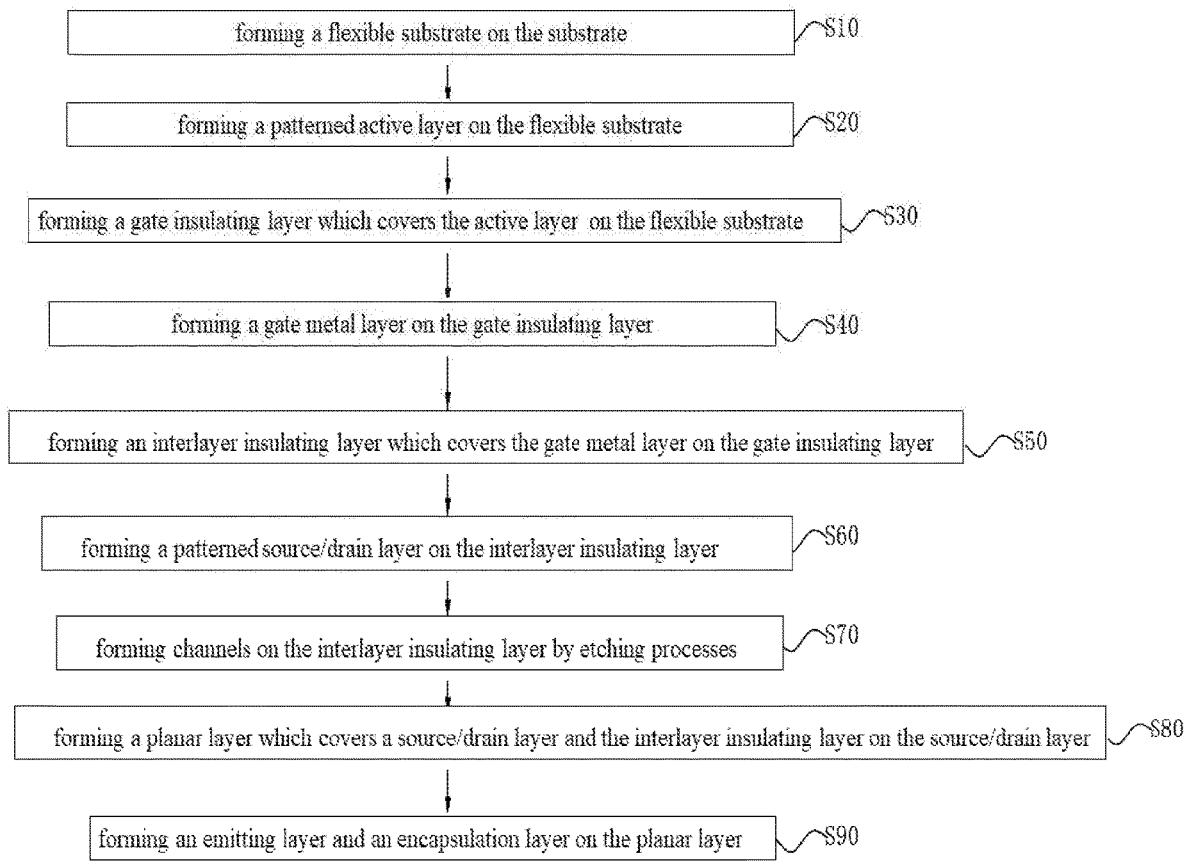
FIG. 2 is a flow chart diagram of manufacturing a flexible display device according to one embodiment of the present invention.

Referring to FIG. 2, a method of manufacturing a flexible display device includes the steps as follows:
step S10 forming a flexible substrate on a substrate;
step S20 forming a patterned active layer on the flexible substrate;
step S30 forming a gate insulating layer which covers the active layer on the flexible substrate;
step S40 forming a gate metal layer on the gate insulating layer;
step S50 forming an interlayer insulating layer which covers the gate metal layer on the gate insulating layer;
step S60 forming a patterned second metal layer on the interlayer insulating layer;
step S70 forming channels on the interlayer insulating layer by etching processes;
step S80 forming a planar layer which covers the second metal layer and the interlayer insulating layer on the second metal layer; and
step S90 forming an emitting layer and an encapsulation layer on the planar layer. It should be noted that the substrate can a be a transparent glass. Of course, it can be understood that the substrate can also be other transparent materials.

Figure 3:
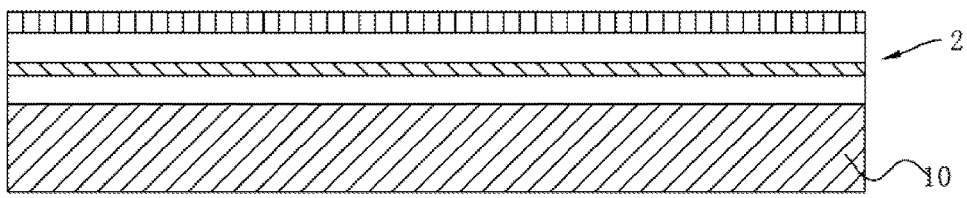
FIG. 3 is a schematic view of forming a flexible substrate according to one embodiment of the present application.

Referring to FIG. 3, a first flexible substrate 21 is formed on a surface of the substrate 10. A first barrier layer 22 is formed on the first flexible substrate 21. A second flexible substrate 23 is formed on a surface of the first barrier layer 22. A second barrier layer 24 is formed on a surface of the second flexible substrate 23, and thereby a flexible substrate 20 is completely formed.

Figure 4:
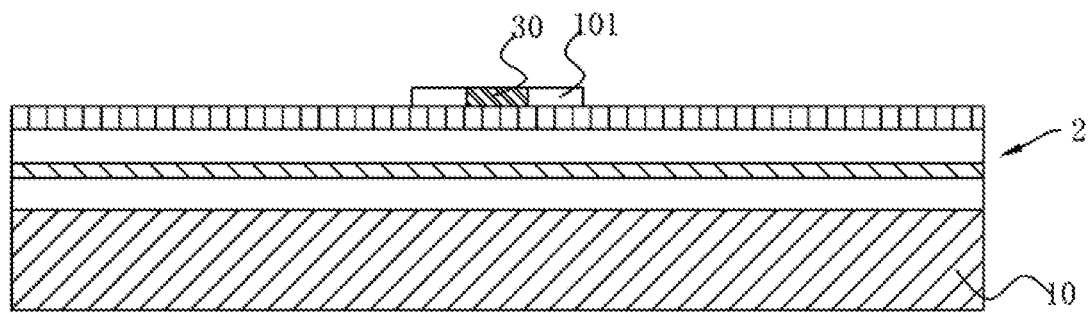
FIG. 4 is a schematic view of forming a patterned active layer according to one embodiment of the present application.

Referring to FIG. 4, an active layer 30 is formed on the flexible substrate 20, and a patterned active layer 30 is formed by etching.

Figure 5:
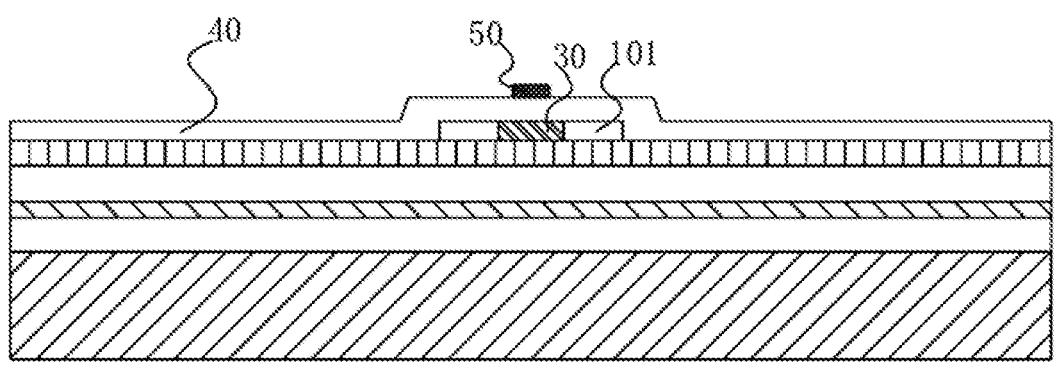
FIG. 5 is a schematic view of forming a gate insulating layer and a gate metal layer according to one embodiment of the present invention.

Referring to FIG. 5, a gate insulating layer 40 is formed on the flexible substrate 20 and covers the active layer 30. A gate metal layer 50 is formed on the gate insulating layer 40.

Figure 6:
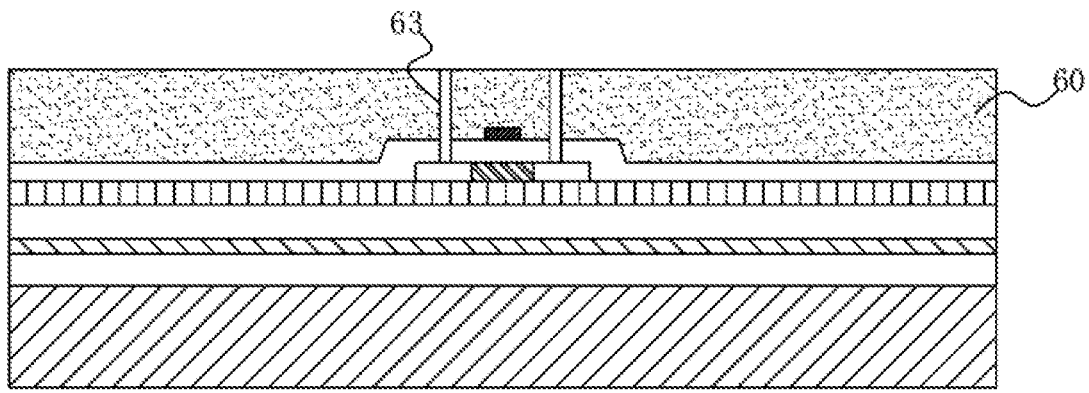
FIG. 6 is a schematic view of forming an interlayer insulating layer according to one embodiment of the present invention.

Referring to FIG. 6, the interlayer insulating layer 60 is formed on the gate insulating layer 40 and covers the gate metal layer 50, and thereby a metal electrode via 63 is formed.

Figure 7:
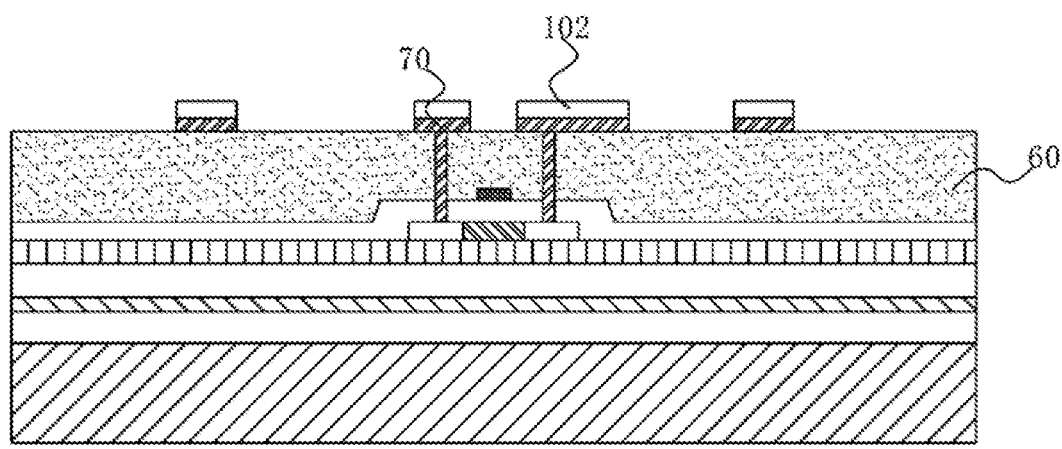
FIG. 7 is a schematic view of forming a patterned second layer according to one embodiment of the present invention.

Referring to FIG. 7, the step S60 includes the steps as follows:
step S61 forming a second metal layer on the interlayer insulating layer 60;
step S62 coating a photoresist layer on the second metal layer, exposing and developing to form a patterned photoresist layer; and
step S63 etching the second metal layer to form a patterned second metal layer.

Figure 8:
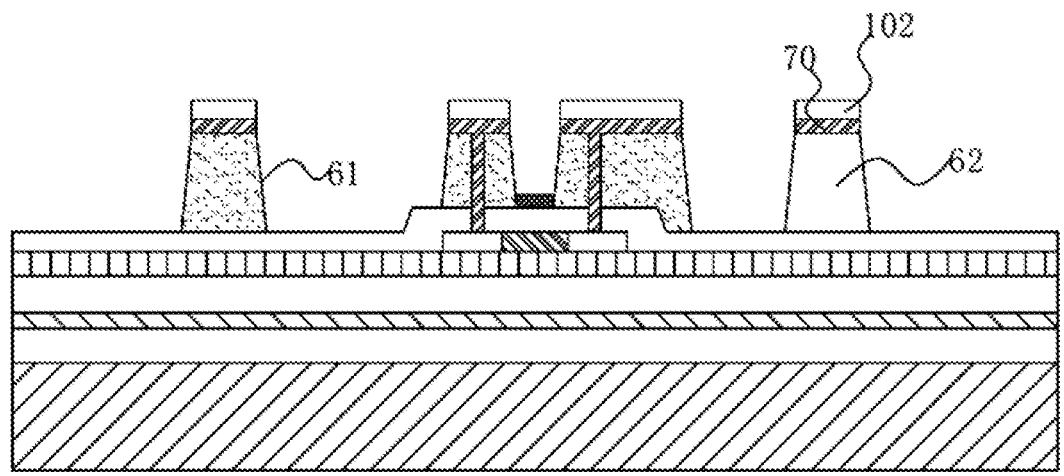
FIG. 8 is a schematic view of forming a channel according to one embodiment of the present invention.

Referring to FIG. 8, in the step S70, the source/drain metal traces 70 are used as a first mask layer so as to etch the interlayer insulating layer 60, and thereby the insulating channels 62 are formed and corresponded to the source/drain metal traces 70 one by one. Source/drain metal is used as an etching mask for the interlayer insulating layer 60 so that the interlayer insulating layer 60 disposed below the source/drain metal traces 70 is kept, and the interlayer insulating 60 without the source/drain metal traces 70 is etched. In addition, the source/drain metal traces 70 corresponded to the insulating channels one by one can be obtained without adding any photomask, and accordingly keep the cost down.

It can be understood that a bending stress concentration region can be formed from wider channels 61, and source/drain metal is used as an etching mask for the interlayer insulating layer 60 so as to ensure the insulating channels 62 have an insulation effect and a hydrogenation function. Meanwhile, reducing the width of the insulating channels 62 can increase the width of the channels 61. Accordingly, a bending stress concentration region can be greatly formed.

In the step S63, after etching, the photoresist layer disposed on the source/drain metal traces 70 is kept, and the photoresist layer is used as a second mask layer so as to etch the interlayer insulating layer 60. When the interlayer insulating layer 60 is etched, the source/drain metal traces 70 are protected from the insulation by the second mask, so as to prevent the source/drain metal traces 70 from affecting or damaging by etching processes. Therefore, there is no need to add any lithography process, and accordingly the processes are reduced and keep the cost down.

Figure 9:
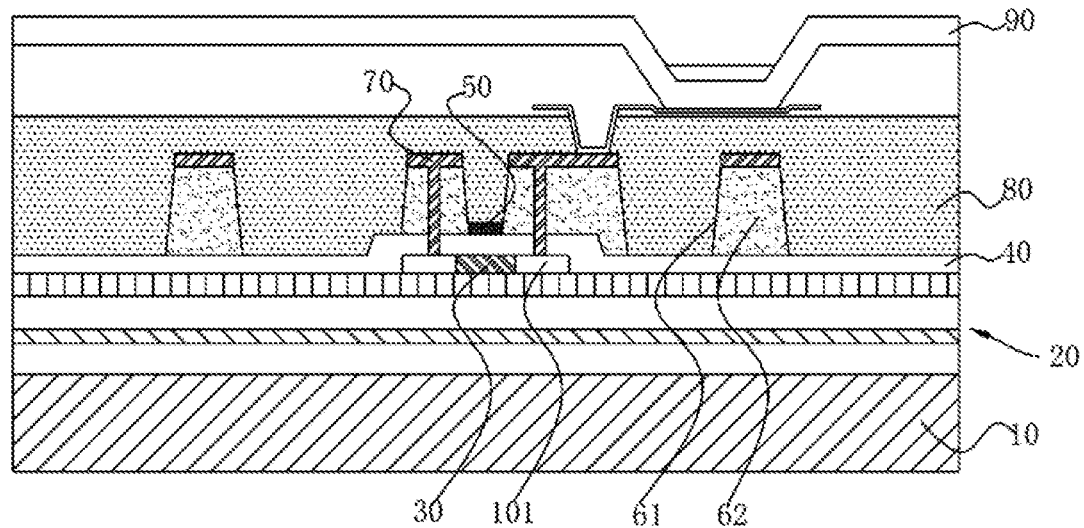
FIG. 9 is a schematic view of forming a flexible display device according to one embodiment of the present invention.

Referring to FIG. 9, a planar layer 80 is formed on the second metal layer and covers the second metal layer and the interlayer insulating layer 60. The display device is formed after forming an emitting layer 90 and an encapsulation layer on the planar layer 80.

The present invention has beneficial effects as follows: the channels 61 disposed on the interlayer insulating layer 60 ensures that the interlayer insulating layer 60 has insulation properties and a hydrogenation function. A patterned interlayer insulating layer 60 is used to replace the existing entire film structure, so that the channels 61 become the deformation occurring main region when the panel is bent. Accordingly, the reliability of the display device is improved under bending stress. Meanwhile, the thin film transistor device failure resulting from the interlayer insulating layer 60 being crack and crack propagation under the bending stress can be prevented. Also, the source/drain metal traces 70 are used as an etching mask for interlayer insulating layer 60 and photoresist. Therefore, insulating channels 62 corresponding to the source/drain metal traces 70 one by one can be obtained without adding any mask, and the channels 61 can be greatly formed in the bending stress concentration region, and accordingly keep the cost down.

Accordingly, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A flexible display device, comprising:
   a flexible substrate;
   an active layer disposed on a surface of the flexible substrate;
   a gate insulating layer disposed on the flexible substrate and covering the active layer;
   a gate metal layer disposed on the gate insulating layer;
   an interlayer insulating layer disposed on the gate insulating layer and covering the gate metal layer;
   a second metal layer disposed on the interlayer insulating layer;
   a planar layer disposed on the gate insulating layer and covering the interlayer insulating layer and the second metal layer; and
   an emitting layer and an encapsulation layer both disposed on the planar layer;
   wherein the interlayer insulating layer is provided with a plurality of channels; two ends of the channels are extending toward edge of the interlayer insulating layer to penetrate the interlayer insulating layer, a vertical projection of the interlayer insulating layer disposed below the second metal layer comprises a vertical projection of the second metal layer, a depth of the channels is not less than a thickness of the interlayer insulating layer, the channels divide the interlayer insulating layer into a plurality of insulating channels, a longitudinal section of the insulating channels is presented as a positive trapezoid; and the second metal layer comprises a plurality of source/drain metal traces, and the insulating channels correspond to the source/drain metal traces one to one.

2. The flexible display device of claim 1, wherein the flexible substrate comprises a first flexible substrate, and a first barrier layer, a second flexible substrate and a second barrier layer are sequentially stacked on the first flexible substrate.

3. A flexible display device, comprising:
   a flexible substrate;
   an active layer disposed on a surface of the flexible substrate;
   a gate insulating layer disposed on the flexible substrate and covering the active layer;
   a gate metal layer disposed on the gate insulating layer;
   an interlayer insulating layer disposed on the gate insulating layer and covering the gate metal layer;
   a second metal layer disposed on the interlayer insulating layer;
   a planar layer disposed on the gate insulating layer and covering the interlayer insulating layer and the second metal layer; and
   an emitting layer and an encapsulation layer both disposed on the planar layer;
   wherein the interlayer insulating layer is provided with a plurality of channels, two ends of the channels are extending toward edge of the interlayer insulating layer to penetrate the interlayer insulating layer, and a vertical projection of the interlayer insulating layer disposed below the second metal layer comprises a vertical projection of the second metal layer, the channels divide the interlayer insulating layer into a plurality of insulating channels, and a longitudinal section of the insulating channel is presented as a positive trapezoid, the second metal layer comprises a plurality of source/drain metal traces, and the insulating channels correspond to the source/drain metal traces one to one.

4. The flexible display device of claim 3, wherein a depth of the channels is not less than a thickness of the interlayer insulating layer.

5. The flexible display device of claim 3, wherein the flexible substrate comprises a first flexible substrate, and a first barrier layer, a second flexible substrate and a second barrier layer are sequentially stacked on the first flexible substrate.

6. A method of manufacturing a flexible display device, comprising steps of:
   step S10 forming a flexible substrate on a substrate;
   step S20 forming a patterned active layer on the flexible substrate;
   step S30 forming a gate insulating layer which covers the active layer on the flexible substrate;
   step S40 forming a gate metal layer on the gate insulating layer;
   step S50 forming an interlayer insulating layer which covers the gate metal layer on the gate insulating layer, wherein a metal electrode via hole is formed during forming the interlayer insulating layer;
   step S60 forming a patterned second metal layer on the interlayer insulating layer;
   step S70 forming channels on the interlayer insulating layer by etching processes;
   step S80 forming a planar layer on the second metal layer, wherein the planar layer covers the second metal layer and the interlayer insulating layer; and
   step S90 forming an emitting layer and an encapsulation layer on the planar layer.

7. The method of manufacturing the flexible display device of claim 6, wherein the step S60 comprises:
- step S61 forming a second metal layer on the interlayer insulating layer;
- step S62 coating a photoresist layer on the second metal layer, exposing and developing the photoresist layer to form a patterned photoresist layer; and
- step S63 etching the second metal layer to form a patterned second metal layer.

8. The method of manufacturing the flexible display device of claim 7, wherein, in the step S70, source/drain metal traces are used as a first mask layer to etch the interlayer insulating layer, and thereby the channels are formed.

9. The method of manufacturing the flexible display device of claim 8, wherein, in the step 63, after etching the second metal layer, the photoresist layer disposed on the source/drain metal traces is kept, and the photoresist layer is used as a second mask layer for etching the interlayer insulating layer.

* * * * *